(12) United States Patent
Yoo et al.

(10) Patent No.: US 10,062,407 B1
(45) Date of Patent: Aug. 28, 2018

(54) MUX SELECT CONTROL OF TWO PHASE SHIFTED DATA IN WRITE PRECOMPENSATION

(71) Applicant: Marvell International Ltd., Hamilton (BM)

(72) Inventors: Myung Jae Yoo, Sunnyvale, CA (US); Ahmed Hesham Mostafa, San Jose, CA (US); Zubir Adal, Union City, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/885,551

(22) Filed: Jan. 31, 2018

Related U.S. Application Data

(60) Provisional application No. 62/462,475, filed on Feb. 23, 2017.

(51) Int. Cl.
| | |
|---|---|
| *G11B 5/09* | (2006.01) |
| *G11B 20/10* | (2006.01) |
| *H03K 5/135* | (2006.01) |
| *H03K 5/00* | (2006.01) |

(52) U.S. Cl.
CPC .......... *G11B 20/10194* (2013.01); *G11B 5/09* (2013.01); *H03K 5/135* (2013.01); *H03K 2005/00052* (2013.01)

(58) Field of Classification Search
CPC ....... G11B 5/02; G11B 27/36; G11B 20/1419; G11B 20/10009; G11B 20/10212; G11B 20/1403; G11B 5/00; G11B 5/012; G11B 5/09
USPC ................ 360/25, 42, 45, 51, 55, 67, 68, 39
See application file for complete search history.

(56) References Cited

U.S. PATENT DOCUMENTS

| | | | |
|---|---|---|---|
| 6,956,708 B1 | 10/2005 | Sutardja et al. | |
| 7,583,459 B1 | 9/2009 | Cheng | |
| 7,646,557 B2 * | 1/2010 | Brady ................ | G11B 5/59688 360/51 |
| 7,880,986 B1 | 2/2011 | Cheng | |
| 9,431,052 B2 | 8/2016 | Oberg et al. | |

* cited by examiner

*Primary Examiner* — Nabil Hindi

(57) ABSTRACT

A precompensation circuit can include: a rising edge interpolator circuit configured to generate a phase shifted rising edge data signal; a falling edge interpolator circuit configured to generate a phase shifted falling edge data signal; a multiplexer circuit coupled with the rising edge interpolator circuit and with the falling edge interpolator circuit to multiplex the phase shifted rising edge data signal and the phase shifted falling edge data signal into an output data signal responsive to a select signal; and a control circuit coupled with the select input of the multiplexer circuit to control production of the output data signal, wherein the control circuit is further coupled with both the rising edge interpolator circuit and the falling edge interpolator circuit to change the select signal to the multiplexer circuit at times determined by both the phase shifted rising edge data signal and the phase shifted falling edge data signal.

20 Claims, 7 Drawing Sheets

MUX SELECT CONTROL OF TWO PHASE SHIFTED DATA IN WRITE PRECOMPENSATION

CROSS REFERENCE TO RELATED APPLICATIONS

Figure 1:
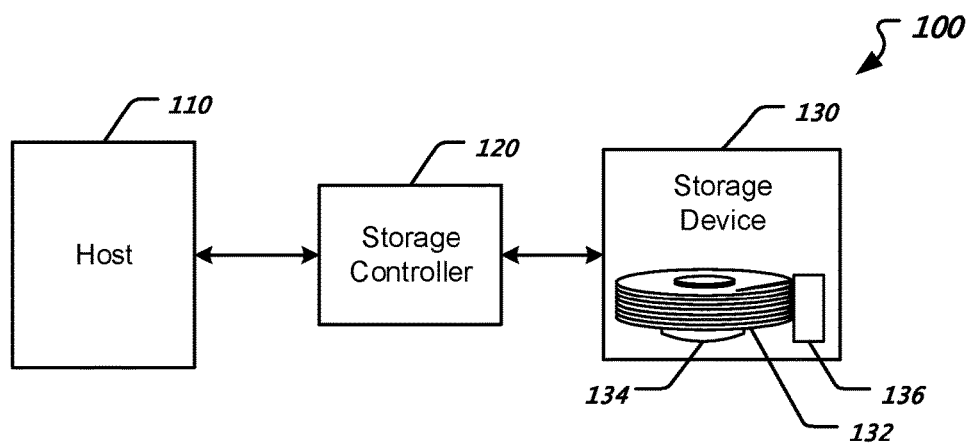

This application claims the benefit of the priority of U.S. Provisional Application Ser. No. 62/462,475 filed Feb. 23, 2017 and entitled "MUX SELECT CONTROL OF TWO PHASE SHIFTED DATA IN WRITE PRECOMPENSATION", which is incorporated herein by reference.

TECHNICAL FIELD

The present disclosure describes systems and techniques relating to electrical circuits and signal processing techniques relating to storage devices, such as hard disk drives (HDD).

BACKGROUND

In magnetic recording, data is written on or read from one or more data tracks of a magnetic storage medium such as a hard disk. The data tracks generally form concentric rings on the surfaces of each of plural hard disks that constitute the magnetic recording device. When writing to such a track, the disk is rotated at predetermined speed, and electrical signals applied to a magnetic read/write head floating over the track are converted to magnetic transitions on the track. The magnetic transitions represent digital data encoded so that each transition may correspond to a ONE bit value and the absence of a transition may correspond to a ZERO bit value as in a "non return to zero inverted" (NRZI) encoding.

To obtain high density recording, magnetic transitions representing data patterns are closely packed on the hard disk magnetic medium. Each transition or absence of a transition of the recording bit sequence is located in a window in which a flux reversal may occur. Such closely packed data bits influence each other so that non-linear magnetic shifting of transitions and bit interference are likely to occur during recording. As a result, the reading of the high density recorded data pattern may be adversely affected. For example, any device mismatch in a high data rate write data path can cause positive/negative transition skew known as pulse pairing so that writing of a single tone square wave can result in a write transition spacing that has other than a 50% duty cycle.

When writing to a high density magnetic recording channel, it can be beneficial to adjust the position of transitions in the data stream to correct for the influence of nearby transitions so that transitions in the recovered data stream are evenly placed. Such precompensation of data being recorded can be accomplished by changing the timing of the magnetic flux reversal in a clock period to offset the magnetic transition shift and interference effects of adjacent and nearby bits. In this way, the transition shift of a bit due to the pattern of preceding and/or succeeding bits is anticipated and the bit recording time is changed to compensate for the magnetic transition shift due to the effects of surrounding bits.

Precompensation of data being recorded can include offsetting a magnetic transition shift. The offset of the magnetic transition shift of a bit due to the pattern of preceding and/or succeeding bits can be anticipated and the bit recording time changed to compensate for the magnetic transition shift due to the effects of surrounding bits.

SUMMARY

The present disclosure describes systems and techniques relating to electrical circuits and signal processing techniques relating to storage devices, such as hard disk drives (HDD).

In high speed storage devices with magnetic storage media, limitations in bandwidth of the write data path can cause degradation of the data being recorded onto the magnetic recording channel. In such cases, in addition to precompensation of data by adjusting the position of transitions in the data stream, the precompensated data can be amplified by a preamp to counteract the bandwidth limitation of the write data path.

One way of improving this pre-amplification step is dynamic control of the gain of the preamp based on the incoming data pattern. For example, the dynamic control signal can be generated based on the presence of consecutive transitions in the incoming data. Consecutive data transitions contain high frequency components that may be more strongly attenuated by the bandwidth-limited write data path than lower frequency components. As a result, consecutive transitions may experience additional degradation of signal compared to longer pulses that result from non-consecutive transitions. As such, gain of the preamp can be increased when the incoming data pattern contains consecutive data transitions, and decreased when the incoming data pattern does not contain consecutive data transitions. An indicator signal indicative of such consecutive data transitions can be generated by digital system that generates the data to be written.

One additional challenge in generating the control signal for dynamic control of the preamp is that the changes in gain of the preamp should be aligned with the incoming data. As the incoming data has been precompensated by adjusting the position of transitions in the data stream, the transitions of the control signal should be adjusted in the same way such that the control signal is aligned with the incoming data.

However, as this preamp control signal is separately generated by the digital system and may be phase shifted independent of the data to be written, an additional phase shift may be necessary to account for a timing relationship between the data and the control signal received at the preamp. Due to this additional phase shift, a circuit for generating the control signal should be able to handle a greater range of phase shifts (e.g., greater than 1 period of the data) on the control signal, and as such, a fixed clock may be unable to ensure proper operation of such circuit. As a solution to this problem, a control signal for the multiplexer for the preamp control signal can be generated by processing the phase shifted data signals, which are input to the multiplexer, for generation of the control signal.

In general, one or more aspects of the subject matter described in this specification can be embodied in one or more circuits, systems, and methods.

A precompensation circuit can include: a rising edge interpolator circuit configured to generate a phase shifted rising edge data signal by phase shifting an input data signal; a falling edge interpolator circuit configured to generate a phase shifted falling edge data signal by phase shifting the input data signal; a multiplexer circuit coupled with the rising edge interpolator circuit and with the falling edge interpolator circuit to multiplex the phase shifted rising edge data signal and the phase shifted falling edge data signal into an output data signal responsive to a select signal received at a select input of the multiplexer circuit; and a control circuit coupled with the select input of the multiplexer circuit to control production of the output data signal, wherein the control circuit is further coupled with both the rising edge interpolator circuit and the falling edge interpolator circuit to change the select signal to the multiplexer circuit at times determined by both the phase shifted rising edge data signal and the phase shifted falling edge data signal.

In various implementations, the precompensation circuit can include various features. For example, the control circuit can include: a XNOR gate coupled with the rising edge interpolator circuit and with the falling edge interpolator circuit to generate a latch enable signal; and a latch coupled with the rising edge interpolator circuit and the XNOR gate to latch the phase shifted rising edge data signal into the select signal responsive to the latch enable signal received at a latch enable input of the latch.

In some implementations, the control circuit further includes a delay element coupled between the rising edge interpolator circuit and the latch to delay the phase shifted rising edge data signal received by the latch relative to the latch enable signal. In some implementations, a delay of the delay element is equal to or greater than a propagation delay of the XNOR gate.

In some implementations, the XNOR gate includes an XOR gate coupled with an inverter.

In some implementations, the control circuit includes: a XNOR gate coupled with the rising edge interpolator circuit and with the falling edge interpolator circuit to generate a latch enable signal; and a latch coupled with the falling edge interpolator circuit and the XNOR gate to latch the phase shifted falling edge data signal into the select signal responsive to the latch enable signal received at a latch enable input of the latch.

In some implementations, the control circuit further includes a delay element coupled between the falling edge interpolator circuit and the latch to delay the phase shifted falling edge data signal received by the latch relative to the latch enable signal.

A disk drive system can include: at least one magnetic media disk; a precompensation circuit configured to generate an output data signal to be written on a surface of the magnetic media disk, the precompensation circuit including, a rising edge interpolator circuit configured to generate a phase shifted rising edge data signal by phase shifting an input data signal; a falling edge interpolator circuit configured to generate a phase shifted falling edge data signal by phase shifting the input data signal; a multiplexer circuit coupled with the rising edge interpolator circuit and with the falling edge interpolator circuit to multiplex the phase shifted rising edge data signal and the phase shifted falling edge data signal into an output data signal responsive to a select signal received at a select input of the multiplexer circuit; and a control circuit coupled with the select input of the multiplexer circuit to control production of the output data signal, wherein the control circuit is further coupled with both the rising edge interpolator circuit and the falling edge interpolator circuit to change the select signal to the multiplexer circuit at times determined by both the phase shifted rising edge data signal and the phase shifted falling edge data signal; and a read/write head configured to write the output data signal onto the surface of the magnetic media disk.

In some implementations, the control circuit includes: a XNOR gate coupled with the rising edge interpolator circuit and with the falling edge interpolator circuit to generate a latch enable signal; and a latch coupled with the rising edge interpolator circuit and the XNOR gate to latch the phase shifted rising edge data signal into the select signal responsive to the latch enable signal received at a latch enable input of the latch.

In some implementations, the control circuit further includes a delay element coupled between the rising edge interpolator circuit and the latch to delay the phase shifted rising edge data signal received by the latch relative to the latch enable signal. In some implementations, a delay of the delay element is equal to or greater than a propagation delay of the XNOR gate.

In some implementations, the XNOR gate includes an XOR gate coupled with an inverter.

In some implementations, the control circuit includes: a XNOR gate coupled with the rising edge interpolator circuit and with the falling edge interpolator circuit to generate a latch enable signal; and a latch coupled with the falling edge interpolator circuit and the XNOR gate to latch the phase shifted falling edge data signal into the select signal responsive to the latch enable signal received at a latch enable input of the latch. In some implementations, the control circuit further includes a delay element coupled between the falling edge interpolator circuit and the latch to delay the phase shifted falling edge data signal received by the latch relative to the latch enable signal.

A method can include: generating, through a rising edge interpolator circuit, a phase shifted rising edge data signal by phase shifting an input data signal; generating, through a falling edge interpolator circuit, a phase shifted falling edge data signal by phase shifting the input data signal; generating, through a control circuit, a select signal for a multiplexer circuit based on both the phase shifted rising edge data signal and the phase shifted falling edge data signal; and multiplexing, through the multiplexer circuit, the phase shifted rising edge data signal and the phase shifted falling edge data signal into an output data signal responsive to the select signal, the output data signal operable to precompensate the input data signal for writing onto a magnetic storage medium.

In some implementations, the generating the select signal includes: determining whether the phase shifted rising edge data signal and the phase shifted falling edge data signal are equal; based on the determination that the phase shifted rising edge data signal and the phase shifted falling edge data signal are equal, outputting phase shifted rising edge data signal as the select signal; and based on determination that the phase shifted rising edge data signal and the phase shifted falling edge data signal are not equal, latching the phase shifted rising edge data signal, and outputting the latched phase shifted rising edge data signal as the select signal.

In some implementations, the latching the phase shifted rising edge data signal includes: delaying the phase shifted rising edge data signal; and latching the delayed phase shifted rising edge data signal.

In some implementations, the delaying the phase shifted rising edge data signal includes: determining a delay in making the determination that the phase shifted rising edge data signal and the phase shifted falling edge data signal are not equal; and delaying the phase shifted rising edge data signal by the determined delay.

In some implementations, the generating the select signal includes: determining whether the phase shifted rising edge data signal and the phase shifted falling edge data signal are equal; based on the determination that the phase shifted rising edge data signal and the phase shifted falling edge data signal are equal, outputting phase shifted falling edge data signal as the select signal; and based on determination that the phase shifted rising edge data signal and the phase shifted falling edge data signal are not equal, latching the phase shifted falling edge data signal, and outputting the latched phase shifted falling edge data signal as the select signal.

In some implementations, the latching the phase shifted falling edge data signal includes: delaying the phase shifted falling edge data signal; and latching the delayed phase shifted falling edge data signal.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable hardware processor) to perform operations in support of the systems and devices, or simulations thereof for use in design of such systems and devices. Moreover, method implementations can be realized from a disclosed system, apparatus or device, and system, apparatus or device implementations can be realized from a disclosed method.

The disclosed embodiments below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

The described systems and techniques can result in one or more of the following advantages. The select signal for controlling the multiplexer of the precompensation circuit can be generated from the phase shifted rising edge data and the phase shifted falling edge data. Write precompensation can be performed on a signal with a phase shift range greater than 1T.

The proposed architecture can allow two concurrently precompensated signals having a fixed timing relationship (e.g., data and preamp control signal) to be transmitted to a receiving circuit. The preamp control signal can have output phase range that is greater than 1T, while allowing both precompensated rising and fallings edges of control signal to be correctly transmitted.

Details of one or more implementations are set forth in the accompanying drawings and the description below. Other features and advantages may be apparent from the description and drawings, and from the claims.

DRAWING DESCRIPTIONS

Figure 2A:
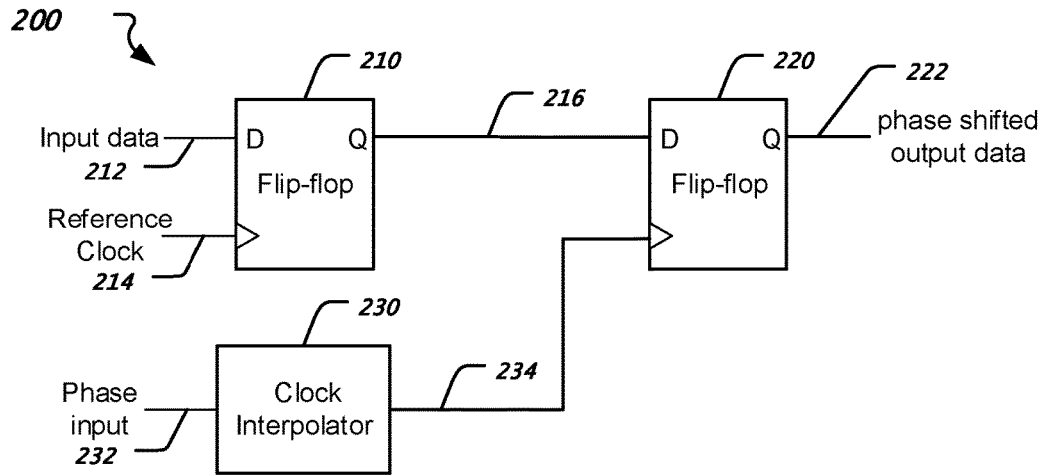
Figure 2B:
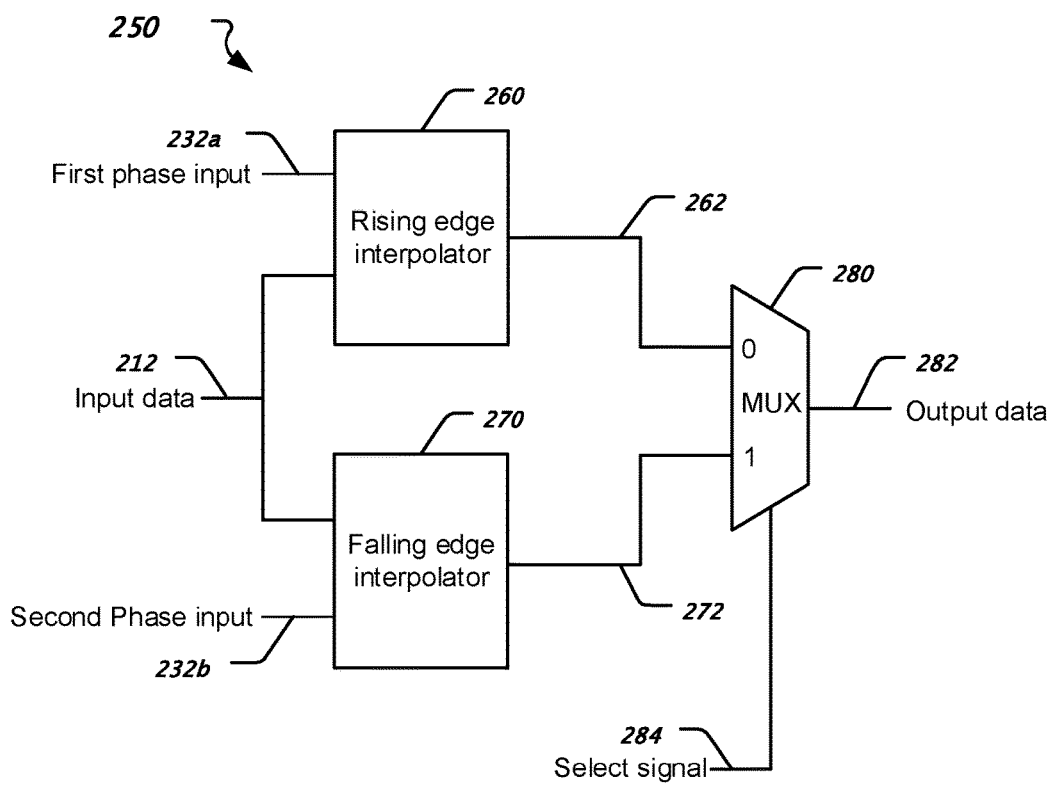
Figure 2C:
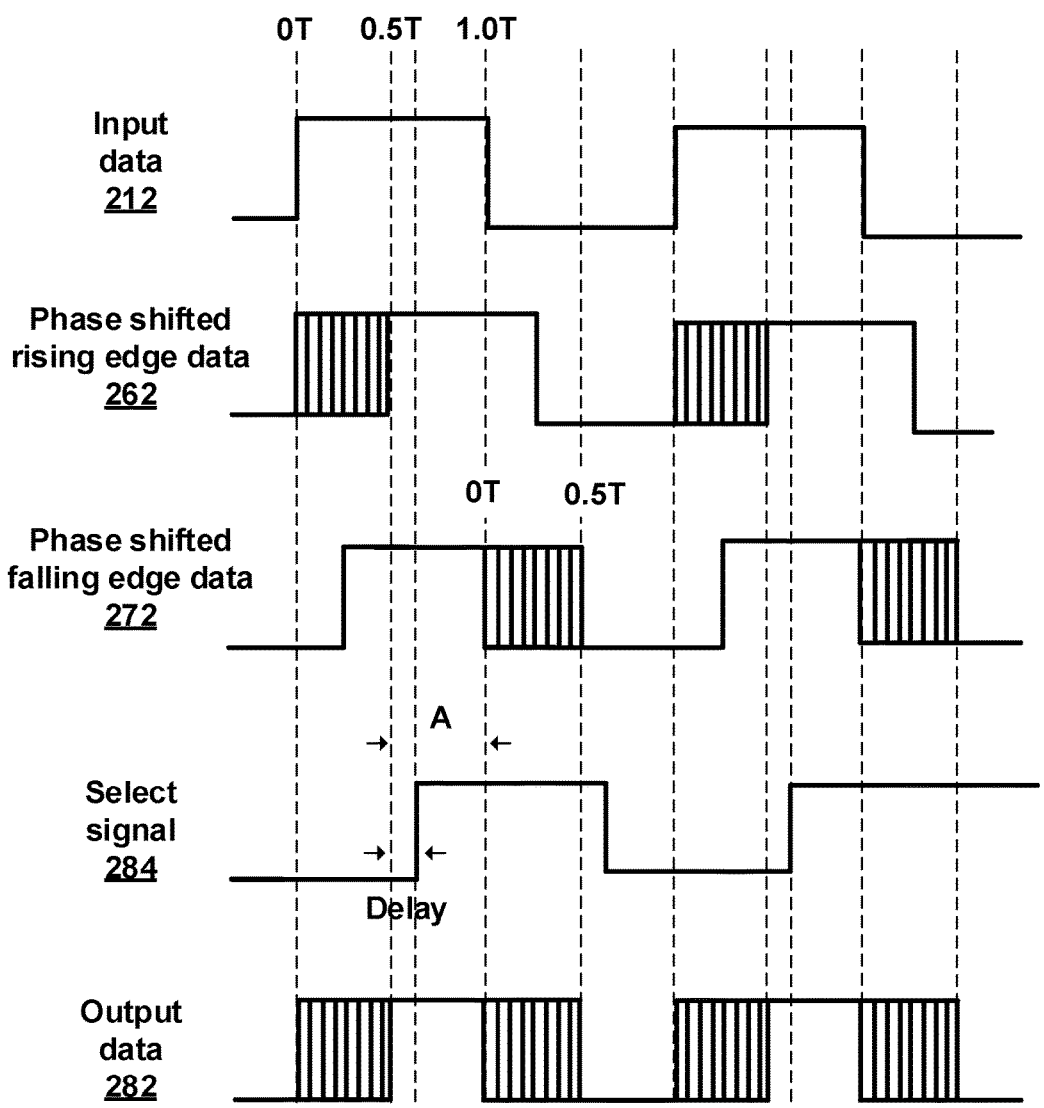
Figure 3A:
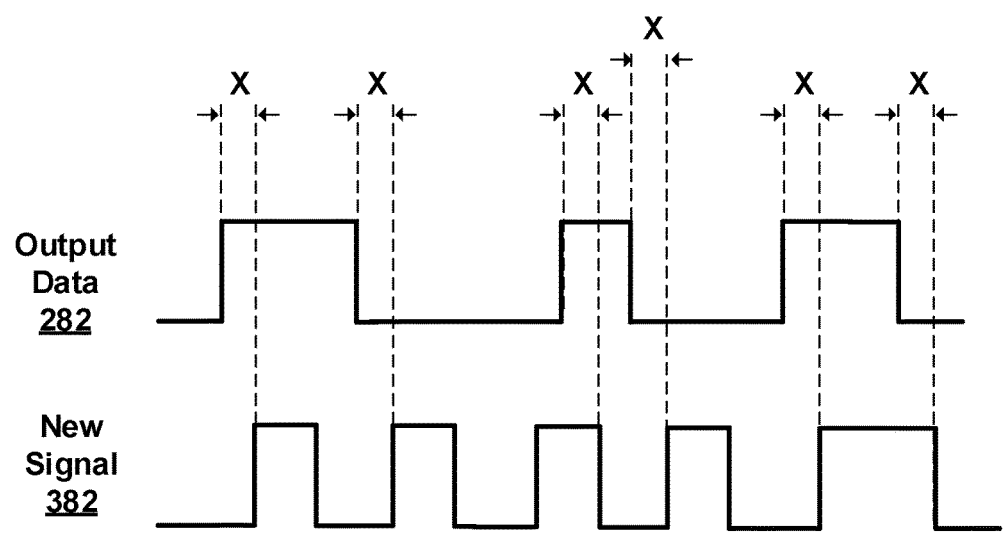
Figure 3B:
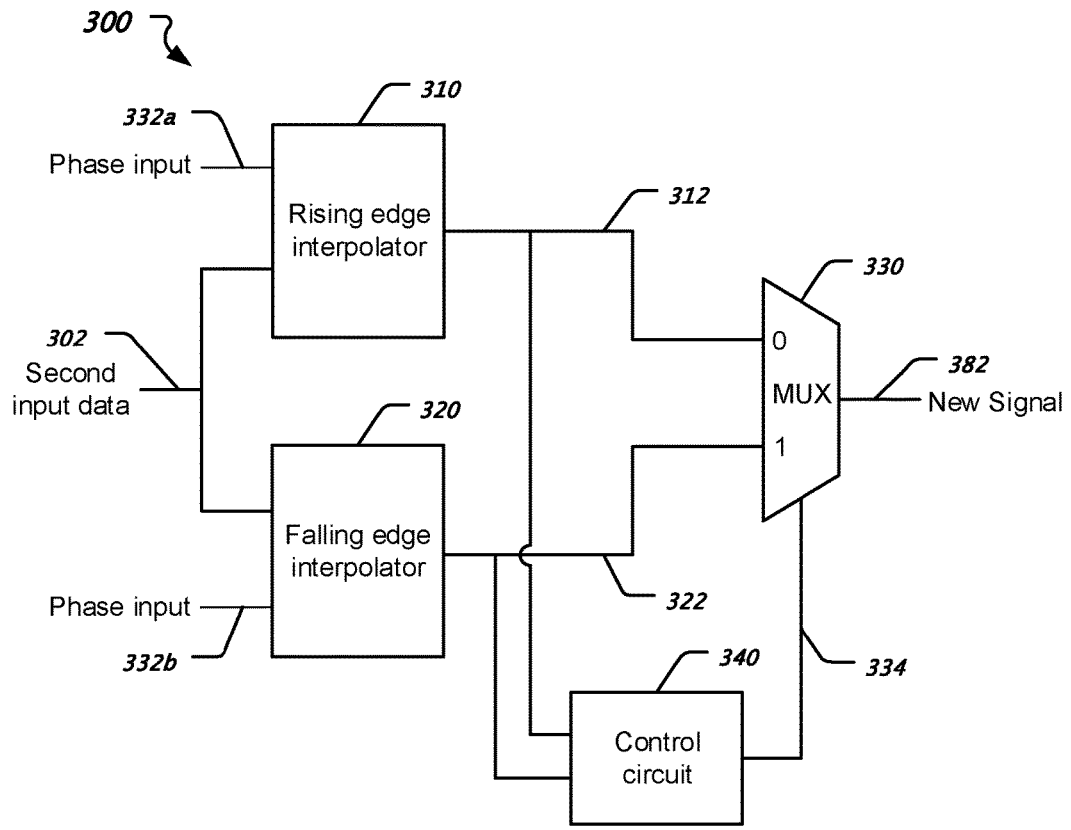
Figure 3C:
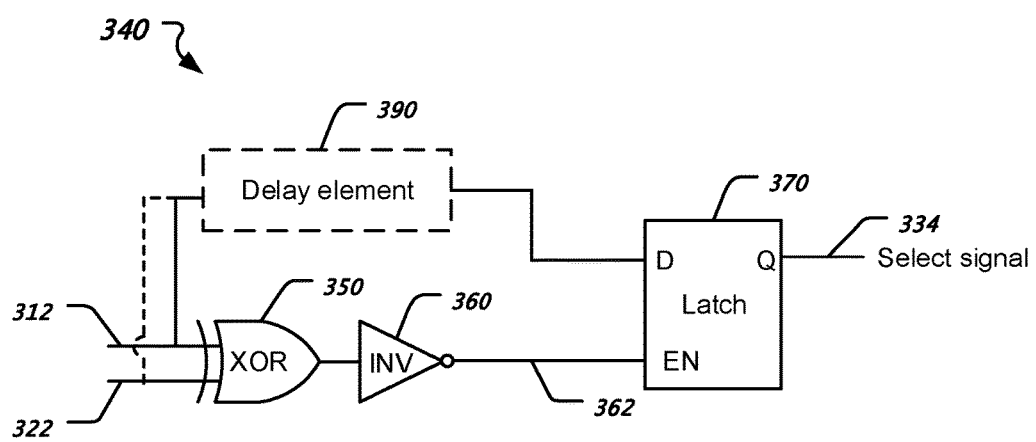
Figure 3D:
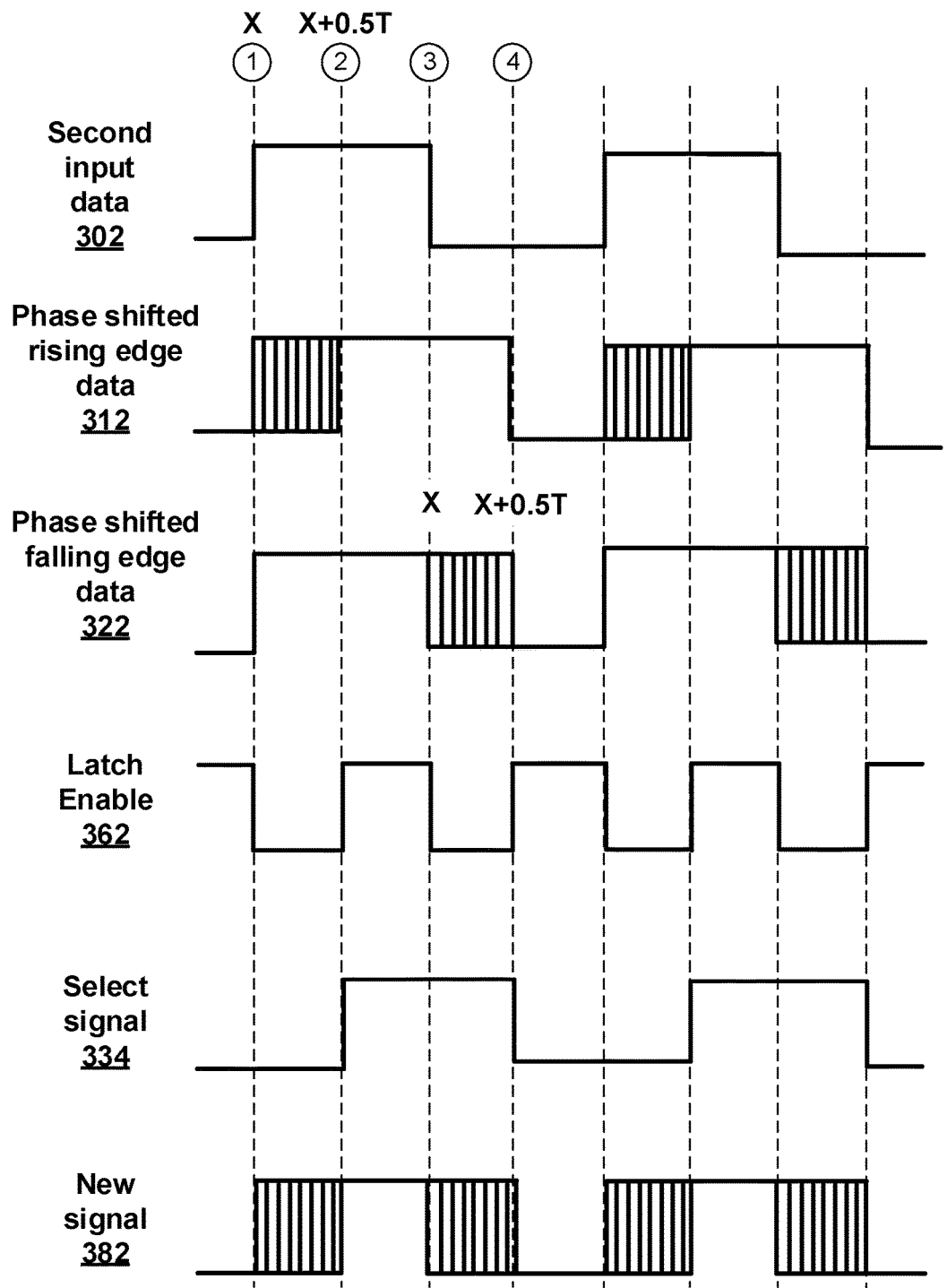
Figure 4:
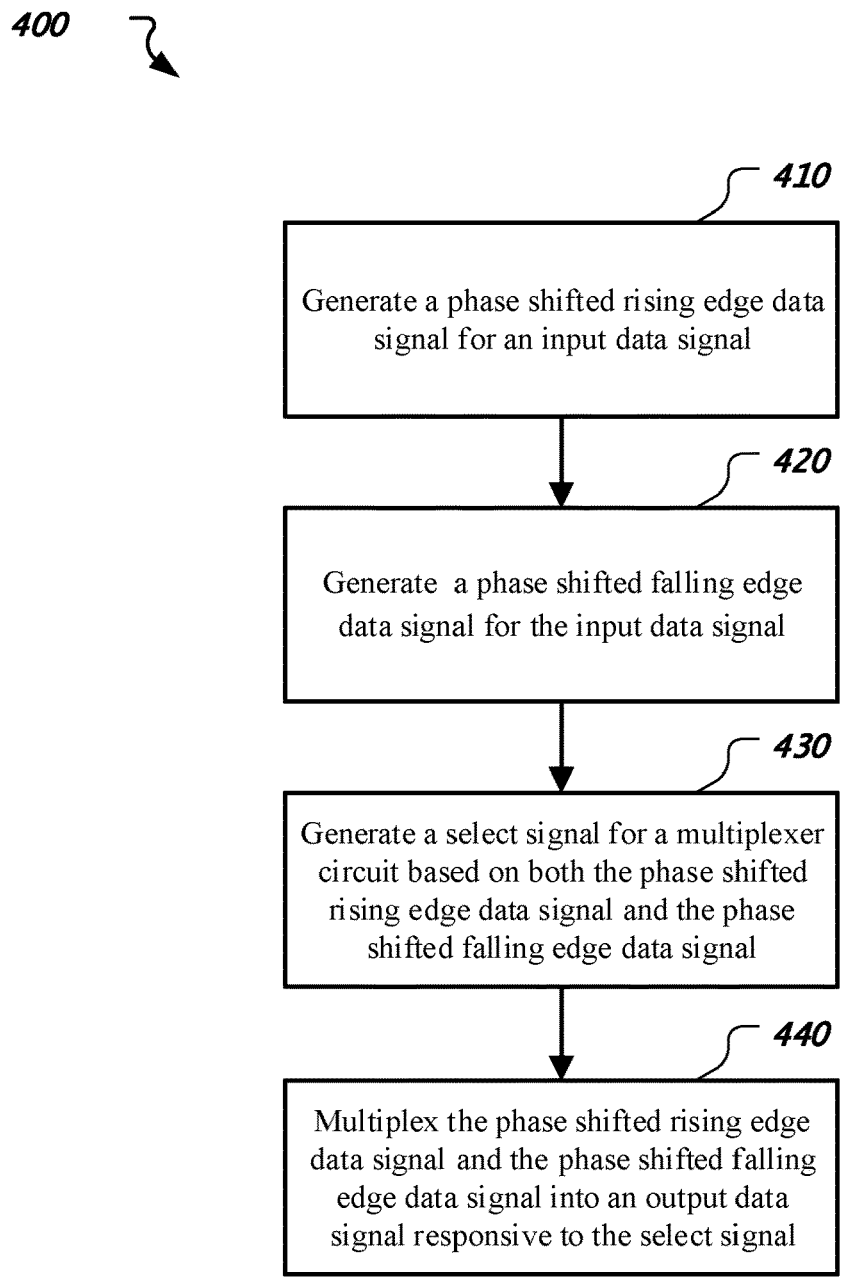

FIG. 1 shows an example of a data storage system.
FIG. 2A shows a block diagram of an example of an interpolator.
FIG. 2B shows a block diagram of an example of a precompensation circuit.
FIG. 2C shows a timing diagram illustrating the generation of the output data by the precompensation circuit of FIG. 2B.
FIG. 3A shows a timing diagram illustrating a relationship between an output data and a new signal.
FIG. 3B shows a block diagram of an example of a precompensation circuit for generation of the new signal.
FIG. 3C shows a block diagram of an example of a control circuit for the precompensation circuit of FIG. 3B.
FIG. 3D shows a timing diagram illustrating the generation of the new signal by the precompensation circuit of FIG. 3B.
FIG. 4 is a flowchart showing an example process for generating the new signal.

Like reference numbers and designations in the various drawings indicate like elements.

DETAILED DESCRIPTION

FIG. 1 shows an example of a data storage system 100. A host 110 is coupled with a storage controller 120. The storage controller 120 interfaces with a storage device 130 and is configured to employ one or more of the systems and techniques described in this disclosure. The storage controller 120 can be implemented in various ways. For example, the storage controller 120 can include a printed circuit board (PCB) with various sets of processing circuitries designed to handle designated tasks. The storage controller 120 can also include registers, volatile memory, non-volatile memory, or a combination of these, which can be used to buffer user data, hold control data or code, or both. In some implementations, the storage controller 120 includes a hardware processor that is programmed to perform specified tasks by firmware, software, or a combination of these.

The storage controller 120 can include a hardware interface through which commands from the host 110 can be received, and the storage controller 120 can decode such host commands and operate the storage device 130 in response thereto. The storage device 130 includes a magnetic recording medium, and can also include various additional types of storage mediums, such as an optical medium, a solid-state memory medium (e.g., NAND-based flash memory), or a combination thereof. In some implementations, the storage device 130 can be a hard disk drive (HDD). Moreover, the storage controller 120 can include various modules, such as a processing module, a control module, a detection module, and a write precompensation module, and the storage controller 120 can be a hard disk controller (HDC) and control HDD functions, such as controlling the speed of a spindle motor, controlling a voice coil motor (VCM), and managing power consumption.

In some implementations, the storage device 130 includes a disk drive with multiple magnetic media disks 132 mounted on an integrated spindle and motor assembly 134. The disk drive further includes a head assembly 136, which can include read signal circuitry, servo signal processing circuitry, and write signal circuitry. The disk drive can also include a PCB, with various drive electronics (e.g., a printed circuit board assembly (PCBA) with semiconductor devices). The magnetic media disks 132 can be coated with a particulate surface or a thin-film surface and can be written to, or read from, a single side or both sides of each disk. The head assembly 136 can include a preamp/writer, where head selection and sense current value(s) can be set.

Although shown as separate elements in FIG. 1, e.g., with signals between the elements carried through a flexible printed cable, the various parts of the data storage system 100 can be integrated into various circuit devices, systems on chip, apparatus, or combinations thereof. The storage controller 120 can be integrated into the host 110 or into the storage device 130. In general, the systems and techniques described herein can be implemented as one or more devices, such as one or more integrated circuit (IC) devices, which may or may not be combined with a storage device at the point of sale.

The storage controller 120 can include a subset of the elements ascribed to it in various examples herein and/or other elements ascribed to the host 110 or the storage device 130. Thus, in some implementations, the storage controller 120 can be one or more IC chips (e.g., a combo chip or system on chip (SOC)), which can include read/write channel signal processing circuitry, which can further include error correction circuitry. The storage controller 120 can be a microprocessor and a hard disk controller, with associated read only memory (ROM) and random access memory (RAM) or interfaces thereto.

Precompensation of data to be written onto a HDD involves shifting of the rising and falling edges of the input data, where both the rising and falling edges are shifted independently based on the data pattern. Typically, the range of shifting of the edges is between 0 to 0.5T, where T is the period of a single bit of the input data. Such phase shifting of data can be performed, for example, using an interpolator circuit.

FIG. 2A shows a block diagram of an example of an interpolator 200. The interpolator 200 includes a first flip-flop 210, a second flip-flop 220, and a clock interpolator 230. The first and second flip-flops are D flip-flops, and have respective data input D, clock input, and data output Q.

The first flip-flop 210 receives an input data (e.g., a stream of bits to be written onto the HDD) on input data line 212 coupled with its D input. Each of the bits has a period T, and the input data has a bit rate corresponding to 1/T. The first flip-flop 210 receives at its clock input a reference clock on reference clock line 214, the reference clock being synchronized with the input data. The reference clock has a fixed phase relationship, or a phase offset, relative to the input data. For example, the fixed phase relationship can be 0.5T. The input data is sampled by the reference clock (e.g., at the rising edge of the clock), and a resulting sampled data output on sampled data line 216 coupled with the data output Q of the first flip-flop 210 is a replica of the data input delayed by the phase offset (e.g., 0.5T) of the reference clock.

The clock interpolator 230 receives a phase input signal on phase input signal line 232, and generates a phase shifted clock on phase shifted clock line 234. In some implementations, the clock interpolator 230 can generate 8 different phases in steps of T/8 from 0T to 7T/8. The phase input signal typically has a range between 0 and 0.5T, and as a result, the phase shifted clock has a phase offset between 0 and 0.5T.

The data output Q of the first flip-flop 210 is coupled with the data input D of the second flip-flop 220 through the sampled data line 216, and the phase shifted clock line 234 carrying the phase shifted clock output by the clock interpolator 230 is coupled with the clock input of the second flip-flop 220. The second flip-flop 220 samples the sampled data using the phase shifted clock (e.g., at the rising edge of the clock), and outputs a phase shifted output data on phase shifted output data line 222 coupled with its data output Q. The phase shifted output data reflects the input data, but includes a variable phase offset of 0 to 0.5T relative to the input data. The input data contains both rising edges and falling edges, and depending on the characteristics (e.g., timing, value) of the phase input signal, the rising and falling edges may be phase shifted together, or shifted independently according to the phase input signal.

By setting the reference clock to 0.5T, which corresponds to the latest phase of the phase shifted output data, hold time issues between the first flip flop 210 and the second flip flop 220 can be mitigated. For example, when the reference clock of the first flip-flop 210 is earlier than the phase shifted clock of the second flip-flop 220, the sampled data output of the first flip-flop 210 can potentially be sampled within the same clock cycle by the second flip-flop 220, which presents a timing issue. To avoid such a timing issue, the reference clock of the first flip-flop should be later or in phase with the phase shifted clock. Such condition can be satisfied, for example, by setting the reference clock phase to 0.5T.

While D flip-flop was used in the example of the interpolator 200, in general, other types of flip-flops may be used, such as a T flip-flop, SR flip-flop, a JK flip-flop, or combinations thereof.

FIG. 2B shows a block diagram of an example of a precompensation circuit 250. The precompensation circuit 250 includes a rising edge interpolator 260, a falling edge interpolator 270, and a multiplexer (MUX) 280. The rising edge interpolator 260 and the falling edge interpolator 270 can be implemented in accordance with the interpolator 200. The rising edge interpolator 260 and the falling edge interpolator 270 are coupled to inputs of the multiplexer 280.

Both the rising edge interpolator 260 and the falling edge interpolator 270 receive the same input data on input data line 212. However, the rising edge interpolator 260 receives a first phase input on first phase input line 232a, and the falling edge interpolator 270 receives a second phase input on second phase input line 232b. The second phase input is independent of the first phase input. Based on the received input data and the first phase input, the rising edge interpolator 260 generates a phase shifted rising edge data signal on phase shifted rising edge data signal line 262. Similarly, based on the received input data and the second phase input, the falling edge interpolator 270 generates a phase shifted falling edge data signal on phase shifted falling edge data signal line 272.

The multiplexer 280 receives the phase shifted rising edge data signal on the phase shifted rising edge data signal line 262 and the phase shifted falling edge data signal on the phase shifted falling edge data signal line 272. The multiplexer 280 outputs one of the two received signals on lines 262 and 272 as output data on output data line 282, or multiplexes, based on a select signal received through select signal line 284. For example, the multiplexer 280 outputs the phase shifted rising edge data signal when the select signal is a binary 0, and outputs the phase shifted falling edge data signal when the select signal is a binary 1.

The bits of the input data arrive at every 1T. The phase shifted rising edge data signal and the phase shifted falling edge data signal can each have different phase offsets relative to the input data within the range of 0 to 0.5T. In an implementation of an interpolator where a single clock interpolator 230 generates clocks for shifting both the rising and falling edges of the input data, it may be difficult for the clock interpolator 230 to settle within 1T without missing a clock pulse or generating a spurious clock pulse when the phase input changes from 0T to 0.5T corresponding to a 0.5T jump in the phase offset.

Such difficulties can be avoided by the configuration of the precompensation circuit 250, which uses dedicated interpolators 260 and 270 for rising and falling edges, respectively. In such a configuration, the minimum time between two consecutive rising or falling same edges is 2T, which can provide enough time for sufficient settling of the clock interpolator 230. Furthermore, while the phase shifted clock of the rising edge interpolator 260 is settling, the multiplexer 280 is controlled such that the phase shifted rising edge data, which is affected by the clock settling, is not output.

FIG. 2C shows a timing diagram illustrating the generation of the output data 282 by the precompensation circuit of FIG. 2B. For clarity of presentation, the falling edge of the phase shifted rising edge data is illustrated as a single fixed edge. However, in general, the falling edge of the phase shifted rising edge data may or may not be shifted, for example, depending on the phase input received at the corresponding time. Similarly, the rising edge of the phase shifted falling edge data is illustrated as a single fixed edge. However, in general, the rising edge of the phase shifted falling edge data may or may not be shifted, for example, depending on the phase input received at the corresponding time. Due to the operation of the precompensation circuit 250, the falling edge of the rising edge data and the rising edge of the falling edge data do not impact the output of the circuit.

The multiplexer 280 can be controlled using an appropriate select signal to generate a composite output data that contains both the rising edges of the phase shifted rising edge data, and the falling edges of the phase shifted falling edge data. Such output data may be called a "write precompensated signal." To generate such output data, the select signal should be switched at a time when both the phase shifted rising edge data and the phase shifted falling edge data are stable and not transitioning to avoid disturbing or corrupting the edges (e.g., generate extra edges) of the output data.

Since the range of phase offsets for the phase shifted rising edge data and the phase shifted falling edge data is between 0 and 0.5T, a fixed and known transition-free window exists between 0.5T and 1.0T. As such, the multiplexer can be switched between the phase offset of 0.5T to 1.0T to avoid disturbing or corrupting the edges. During this time, labeled A, the rising and falling edge data are free of transitions and are at the same logic level, and the multiplexer output can be switched during this time to produce a smooth transition between the two inputs. In some implementations, the select signal is switched at 0.5T+ delay, where the delay is less than 0.5T. The delay can provide a margin from the rising and falling edges of the rising and falling edge data to further ensure that the edges are not disturbed or corrupted. As such, a phase shifted copy of the reference clock with an appropriate phase offset (e.g., 0.6T) can be used as the select signal.

FIG. 3A shows a timing diagram illustrating a relationship between an output data and a new signal. In some cases, a new signal is to be generated from a second input data having a programmable timing difference X relative to the output data, where the new signal tracks the phase shifting of the edges of the output data such that the phase offset between the edges of the new signal and the output data remains stable. For example, this new signal may be a control signal for controlling the preamp of the head assembly 136 to provide control over writing of the precompensated data such as the output data.

The timing difference X can range between 0 to several periods T. The timing difference X can be set using a coarse control and a fine control, where the coarse control sets the difference by multiples of 1T, and the fine control sets the difference by multiples of T/8 in the range between 0 and 1T. The coarse control is equivalent to receiving an input delayed by a specified number of periods T, and can be implemented using bit delays in the digital system that generates the second input data.

Phase of the edges of the output data are varied between 0 and 0.5T by precompensation circuit 250 based on the first and second phase inputs. For the phase offset between the edges of the new signal and the output data to remain stable, the edges of the new signal should track the phase shifting of the edges of the output data, taking into account both the programmable timing difference X and the first and second phase inputs.

As the new signal is independently generated from the second input data, the data pattern can be different between the output data and the new signal. However, referring to FIG. 3A, the timing diagram illustrates a stable phase relationship corresponding to the programmable timing difference X between the edges of the output data and the new signal even when the data pattern between the two are different.

The phase of the new signal that tracks the phase of the output data is a sum of the phase shifts of the edges of the output data and the programmable timing difference X. As the fine control range for the timing difference X is between 0 and 1T, and the phase shift range of the edges of the output data is between 0 and 0.5T, a combined phase shift range of the new signal is between 0 and 1.5T, excluding the contribution from coarse control of the timing difference X. The coarse control in steps of 1T is not included in the calculation of the combined phase shift range as such shifts at the bit level do not affect the generation and timing analysis of the new signal.

FIG. 3B shows a block diagram of an example of a precompensation circuit 300 for generation of the new signal. The output data and the new signal to be generated share characteristics such as transition rate and independent phase control of the rising and falling edges. As such, the general architecture of the precompensation circuit 250, such as the use of two interpolators and a multiplexer, can be adopted for the precompensation circuit 300 for generation of the new signal. However, as previously noted, the combined phase shift range of the new signal is significantly greater than that of the output data, which is limited to 0.5T, and so modifications to the precompensation circuit 250 are made. The modifications are embodied in the precompensation circuit 300.

The precompensation circuit 300 includes a rising edge interpolator 310, a falling edge interpolator 320, and a multiplexer (MUX) 330. The rising edge interpolator 310 and the falling edge interpolator 320 can be implemented in accordance with the interpolator 200. The rising edge interpolator 310 and the falling edge interpolator 320 are coupled to inputs of the multiplexer 330.

Both the rising edge interpolator 310 and the falling edge interpolator 320 receive the same second input data on second input data line 302. However, the rising edge interpolator 310 receives a first phase input on first phase input line 332a, and the falling edge interpolator 320 receives a second phase input on second phase input line 332b. The second phase input is independent from the first phase input. Similar to the phase control signal FIG. 2, the first and second phase inputs have a range between 0 and 0.5T, and as a result, the maximum phase difference between the rising and falling edges is 0.5T. When generating the new signal that tracks the phase relationship of the output data, these first and second phase inputs may be identical to the first and second phase inputs of FIG. 2B. Based on the received second input data and the first phase input, the rising edge interpolator 310 generates a phase shifted rising edge data signal on phase shifted rising edge data signal line 312. Similarly, based on the received second input data and the second phase input, the falling edge interpolator 320 generates a phase shifted falling edge data signal on phase shifted falling edge data signal line 322.

The multiplexer 330 receives the phase shifted rising edge data signal and the phase shifted falling edge data signal. The multiplexer 330 outputs one of the two signals received at the lines 312 and 322 as the new signal on new signal line 382, or multiplexes, based on a select signal received through select signal line 334. For example, the multiplexer 330 outputs the phase shifted rising edge data signal when the select signal is a logical 0, and outputs the phase shifted falling edge data signal when the select signal is a logical 1. The combined phase range of the new signal is between 0 and 1.5T, while the phase shift range of output data is between 0 and 0.5T. As such, in the case of the precompensation circuit 250, the switching of the multiplexer 280 can be performed using the select signal 284 that has a fixed phase relationship relative to the input data or the reference clock. However, for the new signal, as the edges can fall anywhere between −0.5T and 1T relative to a reference clock, a fixed and known transition-free window in which the multiplexer 330 can be switched without disturbing edges may not exist. Even in cases where such a window exists, operating the precompensation circuit 250 and the precompensation circuit 300 on two different reference clocks can create challenges in interfacing those circuits with the digital system that generates the data. Furthermore, a second reference clock generator can take up a significant amount of valuable space in a chip.

One way of overcoming such problems is to dynamically generate the select signal by determining when both inputs of the multiplexer 330, the phase shifted rising edge data signal and the phase shifted falling edge data signal, are the same and switching the output of the multiplexer 330 only when this condition is satisfied. Such select signal can be generated, for example, by implementing a control circuit 340 that processes the phase shifted rising edge data signal and the phase shifted falling edge data signal.

FIG. 3C shows a block diagram of an example of the control circuit 340 for the precompensation circuit of FIG. 3B. The control circuit 340 includes an exclusive OR (XOR) gate 350 coupled with an inverting (NOT) gate 360, and a latch 370. The output of the inverting gate 360 is coupled with an enable input (EN) of the latch 370.

The XOR gate 350 receives the phase shifted rising edge data signal and the phase shifted falling edge data signal, and determines when the two signals on lines 312 and 322 have the same logic value. When the two signals on lines 312 and 322 are both either a logical 1 or a logical 0, the output of the XOR gate 350 is a logical 0, and when the two signals on lines 312 and 322 have different logical values, the output of the XOR gate 350 is a logical 1. The inverting gate 360 that follows the XOR gate 350 inverts the output of the XOR gate, and generates a latch enable signal on latch enable signal line 362. The resulting logical relationship between the two input signals one lines 312 and 322 and the latch enable signal is an exclusive NOR (XNOR) relationship. As such, in some implementations, a XNOR gate or its logical equivalent can be used in place of the XOR gate 350 and the NOT gate 360.

The latch 370 is transparent when the latch enable signal on line 362 received at the latch enable input EN is a logical 1, and holds, or latches onto, the last logic value received at the D input at time of transition of the latch enable signal from logical 1 to logical 0. The latch 370 outputs the select signal on select signal line 334 coupled with its Q output.

In some implementations, a delay element 390 is inserted in the path between the phase shifted rising edge data signal on line 312 coupled with the XOR gate 350 and the data input D of the latch 370. Electronic signals take a finite amount of time in propagating from one node of a circuit to another node, and logic gates such as the XOR gate 350 and the NOT gate 360 have respective propagation delays corresponding to an amount of time it takes for a change in the input to a logic gate to manifest as a change in the output of the logic gate. As such, under certain circumstances, the phase shifted rising edge data signal on line 312 can pass through the latch 370 before an updated latch enable signal on line 362 reaches the latch 370 due to the combined propagation delay of the XOR gate 350 and the NOT gate 360 being greater than the propagation delay of the phase shifted rising edge data signal on line 312, which bypasses the gates and is routed directly to the D input of the latch 370. Such an occurrence leads to an incorrect value of the phase shifted rising edge data signal being held at the output of the latch 370, causing an incorrect switching of the multiplexer 330 and thereby resulting in an incorrectly generated new signal. The delay element 390 can compensate for the combined propagation delays of the XOR gate 350, the NOT gate 360, and any other propagation delays by introducing a delay that is equal to or greater than the combined propagation delay. The delay element 390 can be implemented in various manners. Examples of the delay element 390 include transmission line-based delay lines and a chain of an even number of NOT gates.

FIG. 3D shows a timing diagram illustrating the generation of the new signal by the precompensation circuit of FIG. 3B. The timing diagram illustrates relationships between the phase shifted rising edge data on line 312, the phase shifted falling edge data on line 322, the latch enable signal on line 362, the select signal on line 334, and the new signal on line 382. For clarity of explanation, several timing locations are marked using numerals 1 through 4. X is the programmable timing difference between the output data and the new signal, and marks the starting phase. The multiple vertical lines shown on the phase shifted rising edge data between location 1 and 2 illustrate the variable phase shift of the rising edge ranging between 0 and 0.5T. Similarly, the multiple vertical lines of the phase shifted falling edge data illustrate the variable nature of the locations of the falling edges due to the phase shifting performed by the interpolators. As the new signal is a composite of both the rising edge data and the falling edge data, the new signal illustrates the variable nature of the locations of both the rising and falling edges, as marked by the multiple vertical lines aligned with respective edges of the rising and falling edge data.

For clarity of presentation, while the variable nature of the locations of the edges of the rising and falling edge data have been illustrated, the latch enable signal and the select signal are illustrated for the case when the rising edge data transitions at location 2 corresponding to maximum phase shift of 0.5T, and the falling edge data transitions at location 3 corresponding to the minimum phase shift of 0T, which corresponds to a worst-case timing scenario. Furthermore, for clarity of presentation, the falling edge of the phase shifted rising edge data is illustrated as a single fixed edge corresponding to the maximum phase shift of 0.5T. However, in general, the falling edge of the phase shifted rising edge data may or may not be shifted, for example, depending on the phase input received at the corresponding time. Similarly, the rising edge of the phase shifted falling edge data is illustrated as a single fixed edge corresponding to the minimum phase shift of 0T. However, in general, the rising edge of the phase shifted falling edge data may or may not be shifted, for example, depending on the phase input received at the corresponding time. Due to the operation of the precompensation circuit 300, the falling edge of the rising edge data and the rising edge of the falling edge data do not impact the output of the circuit.

To avoid disturbing or corrupting the edges (e.g., generate extra edges), the transitions of the select signal should take place when the phase shifted rising edge data and the phase shifted falling edge data have the same logical values and are free of transitions. Due to the way the interpolators and the phase inputs are setup, there is a minimum gap of 0.5T between consecutive rising and falling edges, as seen between the location 2 and 3, during which the switching of the output of the multiplexer 330 can safely take place. In this example, at location 2 of the phase shifted rising edge data, the logical values of both the phase shifted rising edge data and the phase shifted falling edge data are the same, resulting in a transition of the latch enable signal from 0 to 1.

The select signal on line 334, which is the output of the latch 370, is initially at 0 at location 1, holding a previous value of the rising edge data. All the decision (e.g., generation of control signals) and switching of the multiplexer 330 should be completed within the 0.5T window between location 2 and 3 for proper operation of the precompensation circuit 300. The multiplexer select signal follows the phase shifted rising edge data, as the multiplexer 330 outputs the phase shifted rising edge data when the select signal is equal to 0, and output the phase shifted falling edge data when the select signal is equal to 1. As such, the phase shifted rising edge data can be used as an input to the latch 370 to generate the select signal, and the transition of the select signal takes place when the logical values of the phase shifted rising edge data and the phase shifted falling edge data are the same.

In response to the latch enable signal transitioning to 1, the latch 370 becomes transparent and passes through the rising edge data on line 312 received at its input to its output as the select signal on line 334. As the rising edge data is a logical 1 at this time (location 2), the select signal transitions to a logical 1 and as a result, the multiplexer 330 switches to outputting the phase shifted falling edge data as the new signal. As the falling edge data has the same logic value of 1 as the rising edge data at the time of this transition, the new signal remains stable without generating extra edges.

At location 3, the falling edge data on line 322 transitions to a logical 0. As a result of the comparison performed by the XOR gate 350 and inversion by the NOT gate 360, the latch enable signal transitions to a logical 0 at location 3. In response to the latch enable signal being a logical 0, the latch 370 latches onto the value of the rising edge data at location 3, which is a logical 1. As a result, the multiplexer 330 continues to output the falling edge data, and the new signal on line 382 reflects the transition of the falling edge data at location 3.

At location 4, the rising edge data on line 312 transitions to a logical 0 and in response, the latch enable signal transitions to a logical 1. In response to the latch enable signal transitioning to 1, the latch 370 becomes transparent and passes through the rising edge data received at its input to its output as the select signal. As the rising edge data is a logical 0 at this time (location 4), the select signal transitions to a logical 0 and as a result, the multiplexer 330 switches to outputting the phase shifted rising edge data as the new signal on line 382. As the rising edge data has the same logical value of 0 as the falling edge data at the time of this transition, the new signal remains stable without generating extra edges. By generating the select signal for the multiplexer 330 by determining when both inputs of the multiplexer 330 are the same and switching output for the multiplexer 330 only when this condition is satisfied, the new signal can be generated in presence of the programmable timing difference X that eliminates a fixed and known transition-free window in which the multiplexer 330 can be switched.

While the operations of the control circuit 340 and the precompensation circuit 300 have been described using the phase shifted rising edge data signal on line 312 as the input signal to the latch 370, the control circuit 340 and the precompensation circuit 300 can be implemented and operated in an analogous manner using the phase shifted falling edge data signal on line 322 as the input signal to the latch 370. Referring back to FIG. 3C, this alternative configuration is illustrated by a dotted line connecting the phase shifted falling edge data signal line 322 to the delay element 390, the dotted line replacing the solid line connecting the phase shifted rising edge data signal line 312 to the delay element 390. As the same second input data is presented to both the rising edge interpolator 310 and the falling edge interpolator 320, and because the transition of the select signal takes place when the phase shifted rising edge data and the phase shifted falling edge data are at the same level, use of either phase shifted data can generate the same select signal.

While one particular implementation of a digital circuit for generating the new signal has been described, analogous functionalities may be achieved through logically equivalent circuits implemented using various digital elements such as universal logic modules (ULM) and look up tables (LUT).

The precompensation circuit 300 can precompensate each data bit of the second input date on line 302 and generate the new signal, which has been precompensated, to the head assembly 136 to be written onto an appropriate sector of a disk. In some implementations, the new signal can be used to control the preamp of the head assembly 136 to provide control over writing of the precompensated data such as the output data on line 282.

While the precompensation circuit 300 has been described in context of generating the new signal for use in writing data onto a HDD, the precompensation circuit 300 can be used for various signal processing and communication applications where modulation of phase of the rising and falling edges, modulation of pulse widths, or combination thereof are desired. For example, the precompensation circuit 300 can be used in compensating for, or equalizing, a frequency-dependent loss of a communication channel such as transmission lines, coaxial cables, and twisted pairs.

FIG. 4 is a flowchart showing an example process 400 for generating the new signal 382. Initially, at 410, a phase shifted rising edge data signal for an input data signal is generated. For example, the phase shifted rising edge data signal can be generated using the interpolator 200 described in connection with FIG. 2A.

At 420, a phase shifted falling edge data signal for the input data signal is generated. For example, the phase shifted falling edge data signal can be generated using the interpolator 200 described in connection with FIG. 2A.

At 430, a select signal for a multiplexer circuit is generated based on both the phase shifted rising edge data signal and the phase shifted falling edge data signal. For example, the select signal can be generated by determining whether the phase shifted rising edge data signal and the phase shifted falling edge data signal are equal; based on the determination that the phase shifted rising edge data signal and the phase shifted falling edge data signal are equal, outputting phase shifted rising edge data signal as the select signal; and based on determination that the phase shifted rising edge data signal and the phase shifted falling edge data signal are not equal, latching the phase shifted rising edge data signal, and outputting the latched phase shifted rising edge data signal as the select signal.

In some implementations, the phase shifted rising edge data signal is delayed, and the delayed phase shifted rising edge data signal is latched. In some implementations, an amount of delay can be determined by determining a delay in making the determination that the phase shifted rising edge data signal and the phase shifted falling edge data signal are not equal.

At 440, the phase shifted rising edge data signal and the phase shifted falling edge data signal are multiplexed into an output data signal responsive to the select signal. For example, the multiplexing can be performed using the multiplexer 330 described in connection with FIG. 3B.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Other embodiments fall within the scope of the following claims.

What is claimed is:

1. A precompensation circuit comprising:
    a rising edge interpolator circuit configured to generate a phase shifted rising edge data signal by phase shifting an input data signal;
    a falling edge interpolator circuit configured to generate a phase shifted falling edge data signal by phase shifting the input data signal;
    a multiplexer circuit coupled with the rising edge interpolator circuit and with the falling edge interpolator circuit to multiplex the phase shifted rising edge data signal and the phase shifted falling edge data signal into an output data signal responsive to a select signal received at a select input of the multiplexer circuit; and
    a control circuit coupled with the select input of the multiplexer circuit to control production of the output data signal,
    wherein the control circuit is further coupled with both the rising edge interpolator circuit and the falling edge interpolator circuit to change the select signal to the multiplexer circuit at times determined by both the phase shifted rising edge data signal and the phase shifted falling edge data signal.

2. The precompensation circuit of claim 1, wherein the control circuit comprises:
    a XNOR gate coupled with the rising edge interpolator circuit and with the falling edge interpolator circuit to generate a latch enable signal; and
    a latch coupled with the rising edge interpolator circuit and the XNOR gate to latch the phase shifted rising edge data signal into the select signal responsive to the latch enable signal received at a latch enable input of the latch.

3. The precompensation circuit of claim 2, wherein the control circuit further comprises a delay element coupled between the rising edge interpolator circuit and the latch to delay the phase shifted rising edge data signal received by the latch relative to the latch enable signal.

4. The precompensation circuit of claim 3, wherein a delay of the delay element is equal to or greater than a propagation delay of the XNOR gate.

5. The precompensation circuit of claim 2, wherein the XNOR gate comprises an XOR gate coupled with an inverter.

6. The precompensation circuit of claim 1, wherein the control circuit comprises:

a XNOR gate coupled with the rising edge interpolator circuit and with the falling edge interpolator circuit to generate a latch enable signal; and a latch coupled with the falling edge interpolator circuit and the XNOR gate to latch the phase shifted falling edge data signal into the select signal responsive to the latch enable signal received at a latch enable input of the latch.

7. The precompensation circuit of claim 6, wherein the control circuit further comprises a delay element coupled between the falling edge interpolator circuit and the latch to delay the phase shifted falling edge data signal received by the latch relative to the latch enable signal.

8. A disk drive system, comprising:
   at least one magnetic media disk;
   a precompensation circuit configured to generate an output data signal to be written on a surface of the magnetic media disk, the precompensation circuit comprising,
      a rising edge interpolator circuit configured to generate a phase shifted rising edge data signal by phase shifting an input data signal;
      a falling edge interpolator circuit configured to generate a phase shifted falling edge data signal by phase shifting the input data signal;
      a multiplexer circuit coupled with the rising edge interpolator circuit and with the falling edge interpolator circuit to multiplex the phase shifted rising edge data signal and the phase shifted falling edge data signal into an output data signal responsive to a select signal received at a select input of the multiplexer circuit; and
      a control circuit coupled with the select input of the multiplexer circuit to control production of the output data signal,
      wherein the control circuit is further coupled with both the rising edge interpolator circuit and the falling edge interpolator circuit to change the select signal to the multiplexer circuit at times determined by both the phase shifted rising edge data signal and the phase shifted falling edge data signal; and
   a read/write head configured to write the output data signal onto the surface of the magnetic media disk.

9. The disk drive system of claim 8, wherein the control circuit comprises:
   a XNOR gate coupled with the rising edge interpolator circuit and with the falling edge interpolator circuit to generate a latch enable signal; and
   a latch coupled with the rising edge interpolator circuit and the XNOR gate to latch the phase shifted rising edge data signal into the select signal responsive to the latch enable signal received at a latch enable input of the latch.

10. The disk drive system of claim 9, wherein the control circuit further comprises a delay element coupled between the rising edge interpolator circuit and the latch to delay the phase shifted rising edge data signal received by the latch relative to the latch enable signal.

11. The disk drive system of claim 10, wherein a delay of the delay element is equal to or greater than a propagation delay of the XNOR gate.

12. The disk drive system of claim 9, wherein the XNOR gate comprises an XOR gate coupled with an inverter.

13. The disk drive system of claim 8, wherein the control circuit comprises:

a XNOR gate coupled with the rising edge interpolator circuit and with the falling edge interpolator circuit to generate a latch enable signal; and a latch coupled with the falling edge interpolator circuit and the XNOR gate to latch the phase shifted falling edge data signal into the select signal responsive to the latch enable signal received at a latch enable input of the latch.

14. The disk drive system of claim 13, wherein the control circuit further comprises a delay element coupled between the falling edge interpolator circuit and the latch to delay the phase shifted falling edge data signal received by the latch relative to the latch enable signal.

15. A method, comprising:
   generating, through a rising edge interpolator circuit, a phase shifted rising edge data signal by phase shifting an input data signal;
   generating, through a falling edge interpolator circuit, a phase shifted falling edge data signal by phase shifting the input data signal;
   generating, through a control circuit, a select signal for a multiplexer circuit based on both the phase shifted rising edge data signal and the phase shifted falling edge data signal; and
   multiplexing, through the multiplexer circuit, the phase shifted rising edge data signal and the phase shifted falling edge data signal into an output data signal responsive to the select signal, the output data signal operable to precompensate the input data signal for writing onto a magnetic storage medium.

16. The method of claim 15, wherein the generating the select signal comprises:
   determining whether the phase shifted rising edge data signal and the phase shifted falling edge data signal are equal;
   based on the determination that the phase shifted rising edge data signal and the phase shifted falling edge data signal are equal, outputting phase shifted rising edge data signal as the select signal; and
   based on determination that the phase shifted rising edge data signal and the phase shifted falling edge data signal are not equal,
      latching the phase shifted rising edge data signal, and
      outputting the latched phase shifted rising edge data signal as the select signal.

17. The method of claim 16, wherein the latching the phase shifted rising edge data signal comprises:
   delaying the phase shifted rising edge data signal; and
   latching the delayed phase shifted rising edge data signal.

18. The method of claim 17, wherein the delaying the phase shifted rising edge data signal comprises:
   determining a delay in making the determination that the phase shifted rising edge data signal and the phase shifted falling edge data signal are not equal; and
   delaying the phase shifted rising edge data signal by the determined delay.

19. The method of claim 15, wherein the generating the select signal comprises:
   determining whether the phase shifted rising edge data signal and the phase shifted falling edge data signal are equal;
   based on the determination that the phase shifted rising edge data signal and the phase shifted falling edge data signal are equal, outputting phase shifted falling edge data signal as the select signal; and based on determination that the phase shifted rising edge data signal and the phase shifted falling edge data signal are not equal,
   latching the phase shifted falling edge data signal, and
   outputting the latched phase shifted falling edge data signal as the select signal.

20. The method of claim 19, wherein the latching the phase shifted falling edge data signal comprises:
   delaying the phase shifted falling edge data signal; and
   latching the delayed phase shifted falling edge data signal.

* * * * *